United States Patent
Kim et al.

(10) Patent No.: US 7,350,295 B2
(45) Date of Patent: Apr. 1, 2008

(54) METHOD OF FABRICATING MULTI-LAYERED PRINTED CIRCUIT BOARD FOR OPTICAL WAVEGUIDES

(75) Inventors: Young-Woo Kim, Chungchungnam-do (KR); Young-Sang Cho, Chungchungbuk-do (KR); Dek-Gin Yang, Chungchungbuk-do (KR); Kyu-Hyok Yim, Chungchungbuk-do (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 0 days.

(21) Appl. No.: 11/401,915

(22) Filed: Apr. 12, 2006

(65) Prior Publication Data
US 2006/0182385 A1  Aug. 17, 2006

Related U.S. Application Data

(62) Division of application No. 10/610,820, filed on Jul. 2, 2003, now Pat. No. 7,046,870.

(30) Foreign Application Priority Data
Dec. 24, 2002  (KR) ............................... 2002-83610

(51) Int. Cl.
*H05K 3/02* (2006.01)
*H05K 3/10* (2006.01)

(52) U.S. Cl. .......................... 29/846; 29/830; 29/832; 156/257; 385/14

(58) Field of Classification Search ............... 29/825, 29/830, 846, 848; 156/153, 154, 257, 268; 385/14, 15, 39, 50, 71, 92; 427/97.1, 97.2
See application file for complete search history.

(56) References Cited

U.S. PATENT DOCUMENTS

| | | | | |
|---|---|---|---|---|
| 4,130,343 A | * | 12/1978 | Miller et al. | 385/49 |
| 4,883,743 A | * | 11/1989 | Booth et al. | 385/50 |
| 5,297,228 A | * | 3/1994 | Yanagawa et al. | 385/129 |
| 5,394,495 A | * | 2/1995 | Booth et al. | 385/59 |
| 5,977,567 A | * | 11/1999 | Verdiell | 257/99 |
| 6,243,517 B1 | | 6/2001 | Deacon | 385/50 |
| 6,373,872 B2 | | 4/2002 | Deacon | 372/34 |

(Continued)

FOREIGN PATENT DOCUMENTS
JP  2003172828  *  6/2003

*Primary Examiner*—Minh Trinh
*Assistant Examiner*—Donghai D. Nguyen
(74) *Attorney, Agent, or Firm*—Morgan, Lewis & Bockius LLP

(57) ABSTRACT

A method of fabricating a multi-layered PCB, in which the optical waveguide component is inserted into the PCB in such a way that a prepreg adhesive does not block an optical signal entrance of the optical waveguide. The method includes pre-routing a portion of an adhesive meeting the optical waveguide to remove the portion, processing an adhesive weeping prevention layer so as to prevent the adhesive from blocking the optical signal entrance of the optical waveguide, arranging the optical waveguide, the adhesive, and the adhesive weeping prevention layer on a copper clad laminate, and combining the optical waveguide, a prepreg, and the adhesive weeping prevention layer with each other into a single structure. The adhesive weeping prevention layer is selected from the group consisting of a prepreg, a single-sided copper clad laminate, a thermally curable resin, a heat spreader, and an unclad.

28 Claims, 17 Drawing Sheets

U.S. PATENT DOCUMENTS

| | | |
|---|---|---|
| 6,839,474 B2 | 1/2005 | Steinberg et al. .............. 385/14 |
| 6,919,508 B2 | 7/2005 | Forcier ...................... 174/52.4 |
| 2004/0136099 A1 | 7/2004 | Kim et al. .................. 359/824 |
| 2004/0145873 A1 | 7/2004 | Kim et al. ................... 361/748 |
| 2005/0269687 A1 | 12/2005 | Forcier ....................... 257/701 |

\* cited by examiner

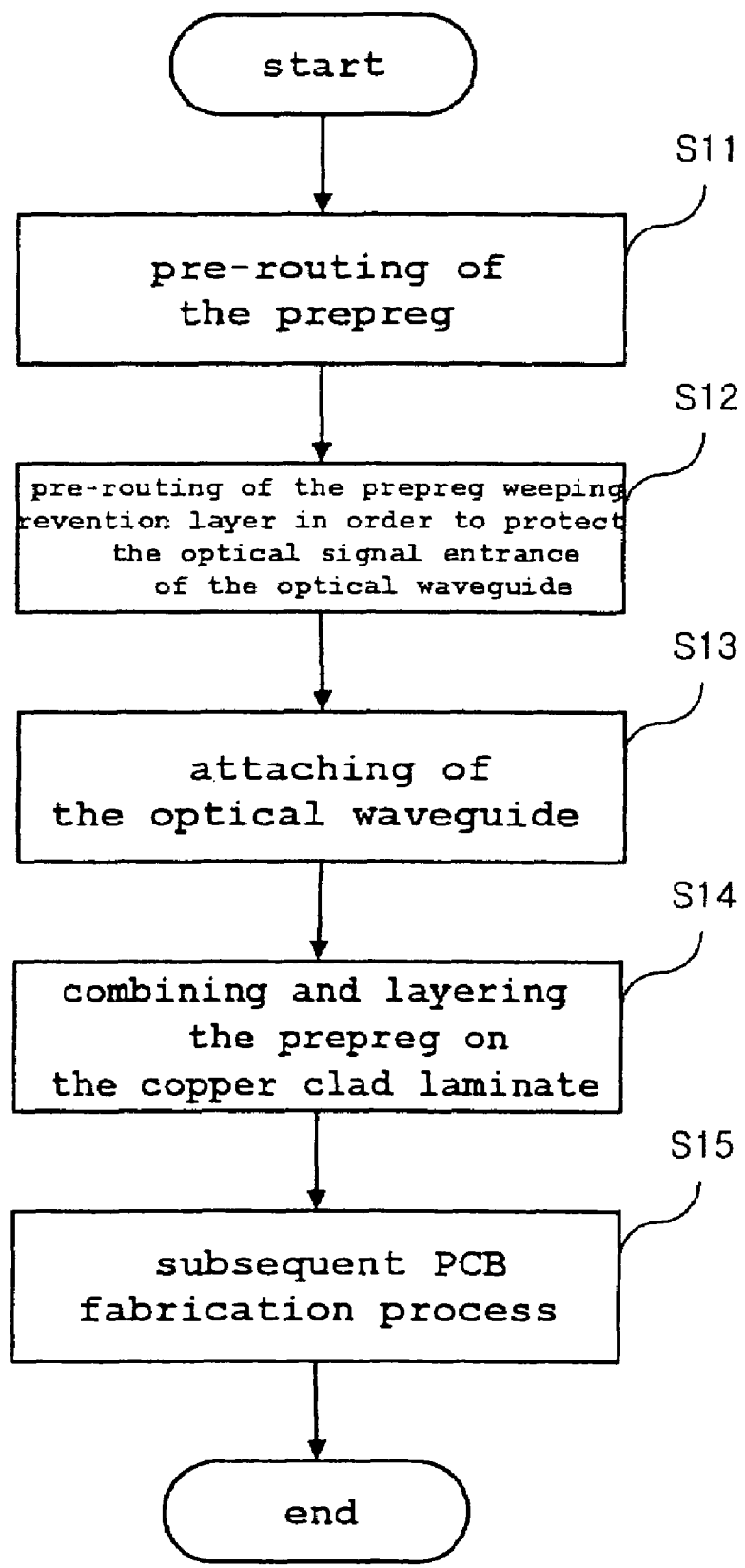

METHOD OF FABRICATING MULTI-LAYERED PRINTED CIRCUIT BOARD FOR OPTICAL WAVEGUIDES

This divisional application of application Ser. No. 10/610,820, filed Jul. 2, 2003, now U.S. Pat. No. 7,046,870, claims the benefit of Korean Patent Application No. 2002-83610, Dec. 24, 2002.

BACKGROUND OF THE INVENTION

1. Field of the Invention.

The present invention relates, in general, to a method of fabricating a multi-layered printed circuit board (PCB) for optical waveguides and, in particular, to a method of fabricating a multi-layered PCB, in which the optical waveguide component is inserted into the PCB in such a way that a prepreg adhesive does not block an optical signal entrance of the optical waveguide.

2. Description of the Prior Art

As well known to those skilled in the art, PCBs are circuit boards whereby various electronic elements are densely mounted on a flat plate consisting of a phenol or epoxy resin and a circuit, electrically connecting the electronic elements to each other, is fixed on a surface of the resin.

A method of fabricating such a PCB includes attaching a copper foil to one side of the phenol or epoxy resin insulating substrate, etching the resulting substrate to form a desired circuit pattern (a portion other than the circuit pattern is eroded and removed), and piercing holes for receiving the electronic elements on the etched substrate.

Further, the PCBs are classified into three types according to the number of patterned layers constituting the PCB: single-sided PCBs, double-sided PCBs, and multi-layered PCBs. The higher the number of the patterned layers is, the higher the number of electronic elements mounted on the patterned layer will be. Of the three kinds of PCBs, accordingly, the multi-layered PCBs are applied to sophisticated products. On the other hand, the single-sided PCBs mostly use phenol substrates and are applied to products provided with simple circuitry such as radios, telephones, and other such simple-structured instruments. The double-sided PCBs mostly use epoxy resin substrates and are applied to products provided with relatively complicated circuitry such as color TVs, VTRs, and facsimile telegraphs. In addition, the multi-layered PCBs as described above are applied to sophisticated products such as 32-bit computers or computers with even higher performance, electronic switchboards, and high performance telecommunication equipment, and each comprise three or more layers with a conductive pattern in such a way that each insulating layer is inserted between adjacent patterned layers.

Furthermore, when there is a need for a portable or removable circuit substrate such as in automation equipment and camcorders, or when the circuit substrate constituting the electronic products is needed to be bent, a flexible PCB is used instead of a rigid PCB.

A conventional PCB comprises a copper plate on which a circuit pattern is formed, and an inner and an outer layer. However, recently, an electro-optical circuit board (EOCB) is frequently used instead of the conventional PCB. At this time, the EOCB is formed by inserting an optical waveguide for transmitting and receiving optical signals and comprising polymer and glass fiber, into the PCB.

In other words, the EOCB is a PCB into which the optical waveguide and a glass plate are inserted after the circuit pattern is already formed on the PCB, and it transmits and receives both electrical signals and optical signals. Additionally, the EOCB functions to convert optical signals into electrical signals so as to store data or process signals in an element mounted on the PCB, and very high-speed data telecommunication is realized when the electrical signal is interfaced with the optical signal in the PCB.

Technologies using the above EOCB are applied to switches of a telecommunication network, transmitting and receiving equipment, switches and servers of data communication equipment, communications equipment for the aerospace and avionics industry, mobile telephone base stations of a universal mobile telecommunications system (UMTS), and a backplanes and daughter boards of high-speed Mainframes and supercomputers.

Additionally, in accordance with the recent trend of rapid increasing use of the Internet and improvements in internet service quality, the amount of data to be processed and transmitted has rapidly increased, so it is necessary to expand bandwidth and rapidly process signals. Accordingly, it is increasingly required to use the EOCB as the medium of optical interfacing. That is to say, the electrical signals used in a conventional PCB are undesirably affected by electromagnetic susceptibility (EMS) characteristics during a high-speed switching process on a GHz band, so there remains a need to adopt optical interfacing which is not limited by the EMS characteristics.

However, although it has been ten years or more since the EOCB was first proposed, a desirable methods has not yet been suggested by which elements, the optical waveguide, and the glass fiber are inserted into the multi-layered PCB. In the history of EOCB technology, there have been three types of EOCB: the first and second EOCBs in which the backplane processes signals using the glass fiber in a point-to-point manner, and the third EOCB in which optical signal interfacing is realized using a multi-channel manner so as to simultaneously process a great quantity of data.

Further, a conventional multi-layered PCB is disadvantageous in that when the optical waveguide is heated so as to combine the optical waveguide with the multi-layered PCB, prepreg consisting of a thermally curable epoxy resin is melted and covers the optical signal entrance of the optical waveguide. In other words, the prepreg covers and blocks the optical signal entrance of the optical waveguide, obstructing transmission of the optical signal.

SUMMARY OF THE INVENTION

Therefore, the present invention has been made keeping in mind the above disadvantages occurring in the prior arts, and an object of the present invention is to provide a method of fabricating a multi-layered PCB for an optical waveguide, in which epoxy resin does not block an optical signal entrance of an optical waveguide, thereby smoothly accomplishing transmission of optical signals through the optical waveguide.

The above object can be accomplished by providing a method of fabricating a multi-layered PCB for optical waveguides, comprising pre-routing a portion of an adhesive meeting an optical waveguide to remove said portion, processing an adhesive weeping prevention layer so as to prevent the adhesive from blocking the entrance of an optical signal entrance of the optical waveguide. The adhesive weeping prevention layer is partially cut. The method also includes arranging the optical waveguide, the adhesive, and the adhesive weeping prevention layer on a copper clad laminate (CCL), and combining the optical waveguide, the prepreg, and the adhesive weeping prevention layer with each other.

At this time, the adhesive is a low-flow epoxy resin prepreg.

Additionally, the adhesive weeping prevention layer is selected from the group consisting of the prepreg, a single-sided copper clad laminate (SSCCL), a thermally curable resin (TC resin), a heat spreader, and an unclad, and the adhesive weeping prevention layer is pre-routed using a router bit or a drill bit. Further, a cut portion of the adhesive weeping prevention layer is smaller than that of a pre-routed adhesive.

Further, the present invention provides a method of fabricating a multi-layered printed circuit board for optical waveguides, comprising pre-routing a first portion of a first prepreg meeting an optical waveguide to remove said first portion, pre-routing a second portion of a second prepreg meeting the first prepreg to remove said second portion, arranging the optical waveguide, the first prepreg, and the second prepreg on a copper clad laminate, and combining the optical waveguide, the first prepreg, and the second prepreg with each other.

At this time, the first prepreg and the second prepreg are partially cut using a router bit or a drill bit so as to prevent the first prepreg and the second prepreg from blocking an optical signal entrance of the optical waveguide.

Additionally, the first prepreg and the second prepreg are a low-flow epoxy resin prepreg, and the first prepreg is pre-routed so as to adjust a height of a combined structure of the first prepreg, the second prepreg and the optical waveguide. Furthermore, a pre-routed portion of the first prepreg is broader than that of the second prepreg.

Furthermore, the present invention provides a method of fabricating a multi-layered printed circuit board for optical waveguides, comprising pre-routing a first portion of a single-sided copper clad laminate (SSCCL) to remove said first portion, pre-routing a second portion of a prepreg meeting the optical waveguide to remove said second portion, arranging the optical waveguide, the prepreg, and the SSCCL on a copper clad laminate (CCL), and combining the optical waveguide, the prepreg, and the SSCCL with each other.

The SSCCL is pre-routed using a router bit or a drill bit so as to prevent the prepreg from blocking an entrance of the optical waveguide.

Further, the prepreg is pre-routed using a router bit or a drill bit so that a stepped part is not formed at a contact part between the optical waveguide and the SSCCL when the optical waveguide is combined with the SSCCL. Furthermore, a pre-routed portion of the SSCCL is broader than that of the prepreg.

Moreover, the present invention provides a method of fabricating a multi-layered printed circuit board for optical waveguides, comprising coating a thermally curable resin on a first copper clad laminate (CCL), cutting a portion of the thermally curable resin to form an optical signal entrance corresponding to a position which is to be met by an optical waveguide, pre-routing a portion of a prepreg meeting the optical waveguide to remove such portion of the prepreg, arranging the optical waveguide, the thermally curable resin, and the prepreg on a second CCL, and combining the optical waveguide, the thermally curable resin, and the prepreg with each other.

The thermally curable resin forms a liquid paste, and is coated on the first CCL by a squeezing process.

Additionally, the prepreg is drilled using a router bit or a drill bit so that a stepped part is not formed at a contact part between the optical waveguide and the thermally curable resin when the optical waveguide is combined with the thermally curable resin, and it is preferable that the prepreg is a low-flow epoxy resin prepreg. Furthermore, a plurality of prepregs are layered on the thermally curable resin so as to adjust a height of a combined structure of the prepregs and the optical waveguide.

Further, the present invention provides a method of fabricating a multi-layered printed circuit board for optical waveguides, comprising etching a portion of a heat spreader to form an optical signal entrance, layering an optical waveguide on a copper clad laminate (CCL), pre-routing a portion of a prepreg meeting the optical waveguide to remove such portion of the prepreg, arranging the optical waveguide, the prepreg, and the heat spreader, and combining the optical waveguide, the prepreg, and the heat spreader with each other.

The heat spreader is made of a copper alloy, and acts as a radiating plate emitting heat generated when the heat spreader is combined with the optical waveguide, and the prepreg is pre-routed using a router bit or a drill bit so that the heat spreader comes into contact with an epoxy insulating side of the CCL when the optical waveguide is combined with the heat spreader.

In addition, the present invention provides a method of fabricating a multi-layered printed circuit board for optical waveguides, comprising etching a portion of an unclad to form an optical signal entrance, layering an optical waveguide on a copper clad laminate (CCL), pre-routing a portion of a prepreg meeting the optical waveguide to remove such portion of the prepreg, arranging the optical waveguide, the prepreg, and the unclad, and combining the optical waveguide, the prepreg, and the unclad with each other.

At this time, the unclad is a completely cured core (C-stage core) produced by removing all copper foils from the CCL, and the prepreg is pre-routed using a router bit or a drill bit so that the unclad comes into contact with an epoxy insulating side of the CCL when the optical waveguide is combined with the unclad.

Moreover, the present invention provides a multi-layered printed circuit board for optical waveguides, comprising a copper clad laminate (CCL) used as an inner layer of the multi-layered printed circuit board, and an optical waveguide, for an optical signal interfacing, positioned on the CCL. An adhesive is combined with the optical waveguide while being pre-routed at a predetermined portion thereof. Additionally, an adhesive weeping prevention layer is pre-routed so as to prevent the adhesive from blocking an entrance of the optical waveguide.

At this time, it is preferable that the adhesive is a low-flow epoxy resin prepreg, and the adhesive weeping prevention layer is selected from the group consisting of a prepreg, a single-sided copper clad laminate, a thermally curable resin, a heat spreader, and an unclad. Additionally, the adhesive weeping prevention layer is pre-routed using a router bit or a drill bit.

Therefore, the present invention is advantageous in that prepreg and an adhesive weeping prevention layer are pre-routed to prevent an epoxy resin from blocking an optical signal entrance of an optical waveguide, thereby facilitating precise interfacing of optical signals.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a flowchart illustrating a fabrication method of a multi-layered PCB for optical waveguides according to the present invention, in which an adhesive does not block an optical signal entrance of an optical waveguide, thereby smoothly accomplishing transmission of optical signals through the optical waveguide;

DETAILED DESCRIPTION OF THE INVENTION

Figure 2A:
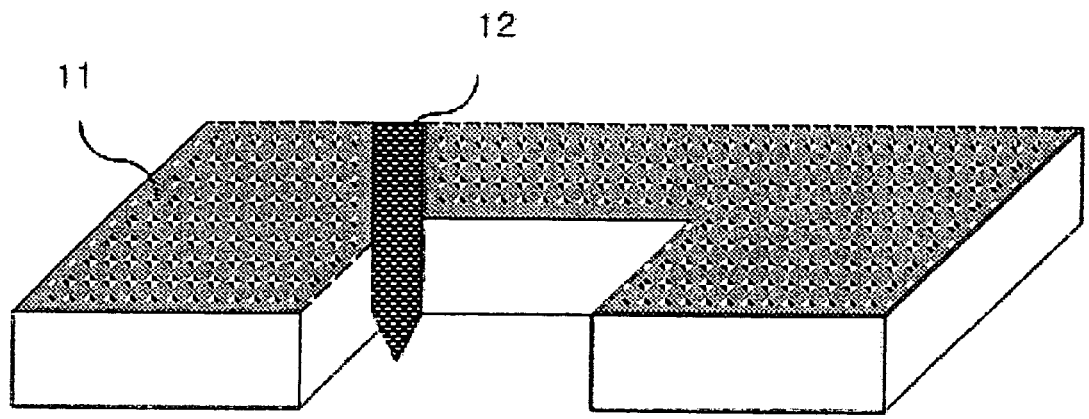
FIGS. 2a to 2d illustrate a stepwise fabrication process of a multi-layered PCB for optical waveguides using prepreg according to a first embodiment of the present invention, in which an adhesive does not block an optical signal entrance of an optical waveguide.

Reference now should be made to the drawings, in which the same reference numerals are used throughout the different drawings to designate the same or similar components.

FIG. 1 is a flowchart illustrating a fabrication method of a multi-layered PCB for optical waveguides according to the present invention, in which an adhesive does not block an optical signal entrance of an optical waveguide, thereby smoothly accomplishing transmission of optical signals through the optical waveguide.

With reference to FIG. 1, the method of fabricating the multi-layered PCB for optical waveguides according to the present invention comprises pre-routing a portion of prepreg meeting the optical waveguide to partially remove the prepreg in operation S11, and pre-routing an adhesive weeping prevention layer so as to prevent an epoxy resin from blocking the optical signal entrance of the optical waveguide. At this time, the adhesive weeping prevention layer is selected from the group consisting of a second prepreg, a single-sided copper clad laminate (SSCCL), a thermally curable resin (TC resin), a heat spreader, and an unclad.

The method also includes arranging positions of the prepreg and the adhesive weeping prevention layer in operation S13, and simultaneously combining the optical waveguide, the prepreg, and the adhesive weeping prevention layer on the copper clad laminate in operation S14.

After the optical waveguide is inserted and combined to the PCB, the resultant multi-layered PCB is accomplished by subsequent steps in operation S15.

Therefore, the prepreg and the adhesive weeping prevention layer are pre-routed to prevent the epoxy resin from blocking the optical signal entrance of the optical waveguide, thereby facilitating precise interfacing of the optical signals.

FIRST EMBODIMENT

There will be now given a detailed description of a method of fabricating a multi-layered PCB for optical waveguides according to a first embodiment of the present invention.

FIGS. 2a to 2d illustrate a stepwise fabrication process of a multi-layered PCB for optical waveguides using prepreg according to the first embodiment of the present invention, in which an adhesive does not block an optical signal entrance of an optical waveguide.

In detail, FIG. 2a illustrates prepreg 11 which is being pre-routed. The reason the prepreg 11 is pre-routed is that the prepreg 11 should not cover an optical signal entrance of the optical waveguide. Accordingly, the prepreg 11 is cut using a router bit or a drill bit as shown in FIG. 2a. The prepreg 11 consists of a sheet cured to a B-stage phase by impregnating a thermally curable resin in a base material such as glass fiber, and the B-stage phase means a partially cured resin. Useful as the prepreg 11 in the present invention is a low-flow epoxy resin.

Figure 2B:
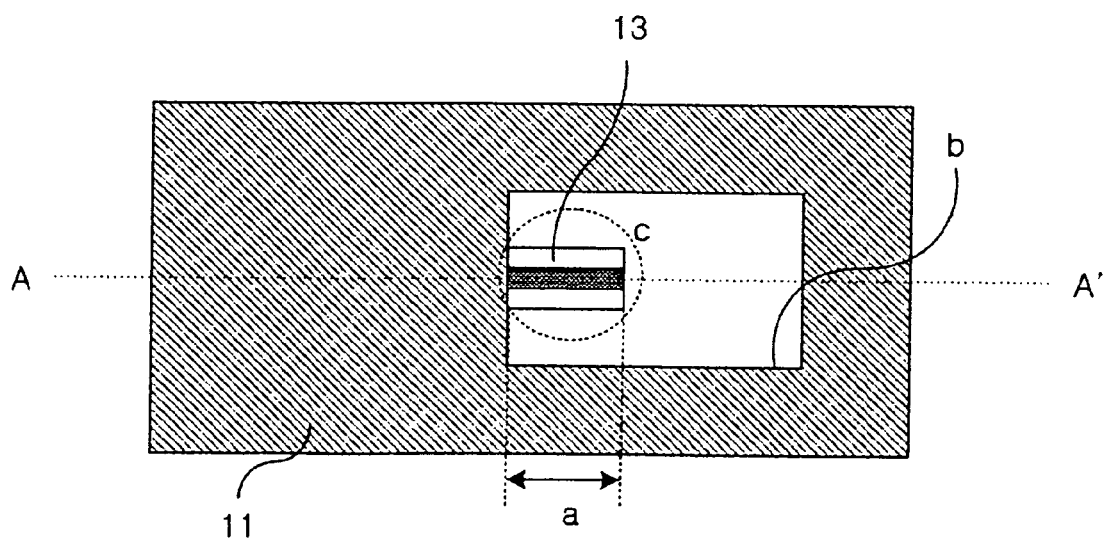

In FIG. 2b, the reference characters b and c denote an area of the prepreg 11 which is partially cut and a contact part between the optical waveguide and said area, respectively. Additionally, the reference character a denotes an exposed interval of the optical waveguide 13. That is to say, the optical waveguide 13 is partially exposed by the interval a in the area b of the prepreg 11 which is partially cut.

Figure 2C:
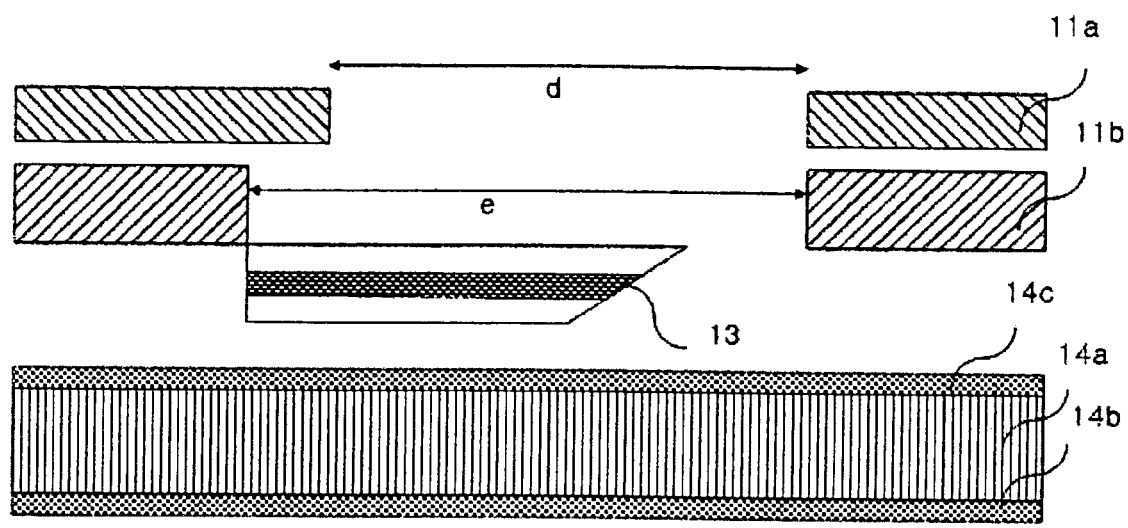

FIG. 2c is a sectional view taken along a line A-A' of FIG. 2b, in which a first prepreg 11b, a second prepreg 11a, and the optical waveguide 13 are not combined with each other. At this time, the first and second prepreg 11b, 11a are respectively pre-routed by intervals e and d, and the first prepreg 11b is pre-routed so as to adjust a height of a combined structure of the first and second prepreg and the optical waveguide 13. The second prepreg 11a is positioned on the first prepreg 11b such that it is not coated on the entire optical waveguide 13. The interval d is narrower than the interval e because the optical waveguide is occupied by a difference between intervals d and e. Furthermore, reference numerals 14a to 14c denote a copper clad laminate (CCL) comprising an epoxy resin 14a and copper foils 14b, 14c respectively coming into contact with both sides of the epoxy resin.

Figure 2D:
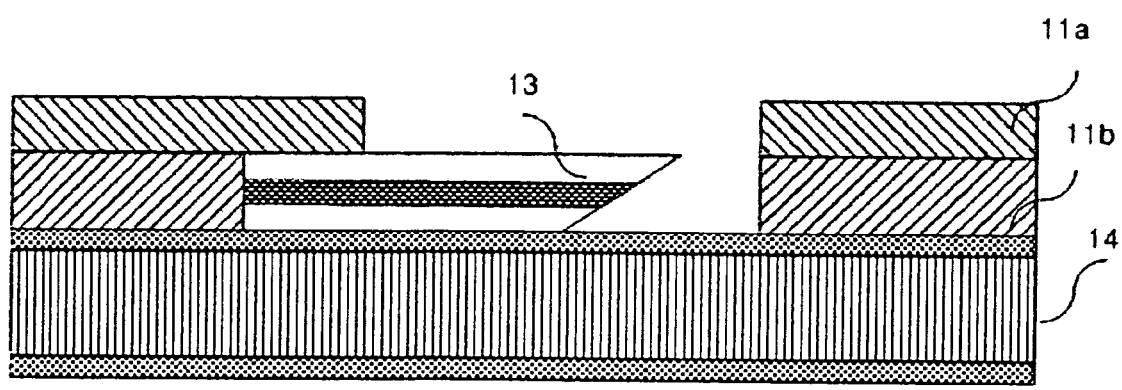

With reference to FIG. 2d, there is illustrated a sectional view taken along a line A-A' of FIG. 2b, that is, a sectional view of the multi-layered PCB for optical waveguides, in which a first prepreg 11b, a second prepreg 11a, and the optical waveguide 13 are combined with each other into a single structure. In practice, the copper clad laminate 14, the optical waveguide 13, and the first and second prepreg 11b, 11a are simultaneously combined into a single structure using a predetermined temperature and pressure.

In other words, because the first and second prepreg 11b, 11a are combined with the optical waveguide 13 after being pre-routed, the optical signal entrance of the optical waveguide 13 for leading the optical signal is not coated with the prepreg. Thereafter, a portion of the optical waveguide 13 is attached by a mirror (not shown), and the resulting combined structure is, thereafter, subjected to subsequent processes to accomplish the desired multi-layered PCB.

SECOND EMBODIMENT

A detailed description of a method of fabricating a multi-layered PCB for optical waveguides according to a second embodiment of the present invention will be given, below.

FIGS. 3a to 3e illustrate a stepwise fabrication process of a multi-layered PCB for optical waveguides using a single-sided copper clad laminate according to the second embodiment of the present invention, in which an adhesive does not block an optical signal entrance of an optical waveguide.

Figure 3A:
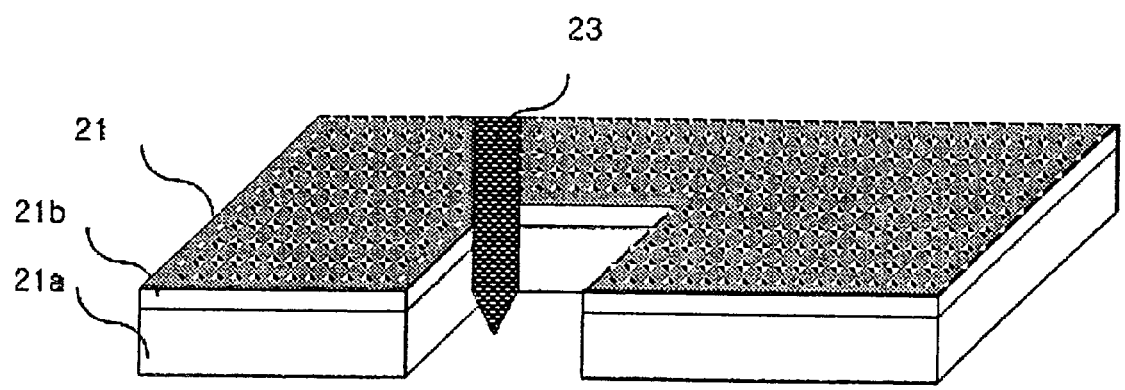
FIGS. 3a to 3e illustrate a stepwise fabrication process of a multi-layered PCB for optical waveguides using a single-sided copper clad laminate according to a second embodiment of the present invention, in which an adhesive does not block an optical signal entrance of an optical waveguide.

In detail, FIG. 3a illustrates a pre-routing process of the single-sided copper clad laminate 21 of the second embodiment. The reason why the SSCCL 21 is pre-routed is that prepreg 11 should not be coated on an optical signal entrance of the optical waveguide when the optical waveguide is combined with the SSCCL 21, like the prepreg 11 of the first embodiment. The SSCCL 21 means a copper clad laminate from which a copper foil is removed on its one side. In other words, a CCL has two copper foils on both sides of an epoxy insulating layer 21a, but the SSCCL 21 has one copper foil on any one side of the epoxy insulating layer 21a. Like the first embodiment, the SSCCL 21 is partially cut in a predetermined shape as shown in FIG. 3a so as to expose a portion of the optical waveguide using a router bit or a drill bit.

Figure 3B:
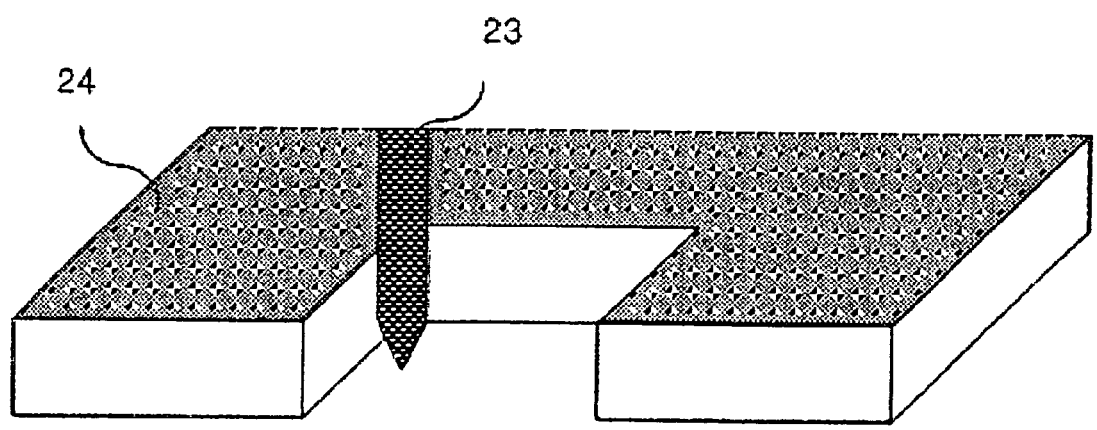

With reference to FIG. 3b, there is illustrated a pre-routing process of the prepreg 24. At this time, the prepreg 24 is pre-routed using the router bit or drill bit 23 as shown in FIG. 3b like the first embodiment so that a stepped part is not formed at a contact part between the optical waveguide and the SSCCL. Furthermore, the prepreg 24 consists of a low-flow epoxy resin.

Figure 3C:
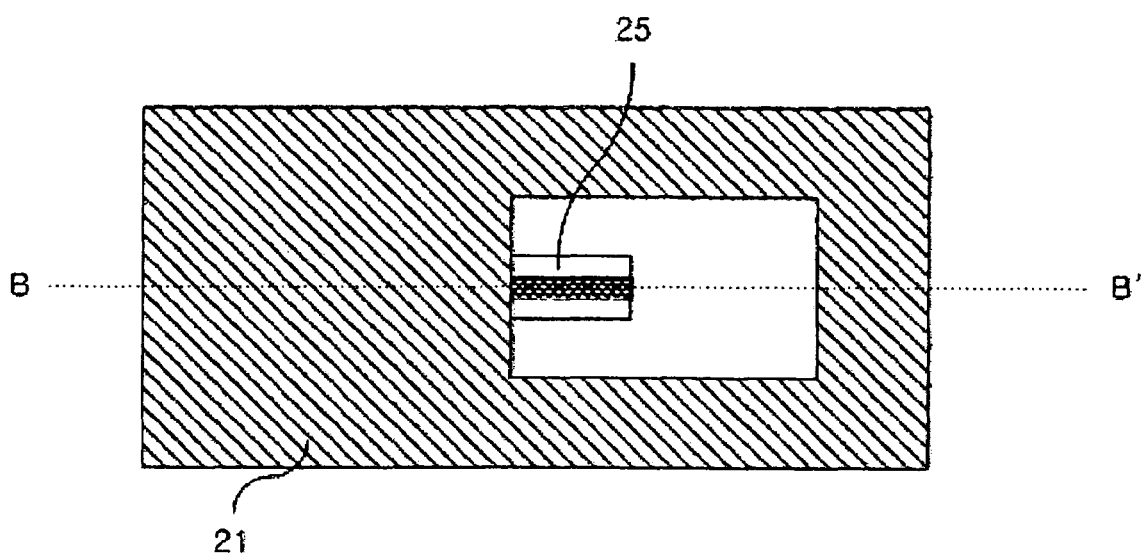
Figure 3D:
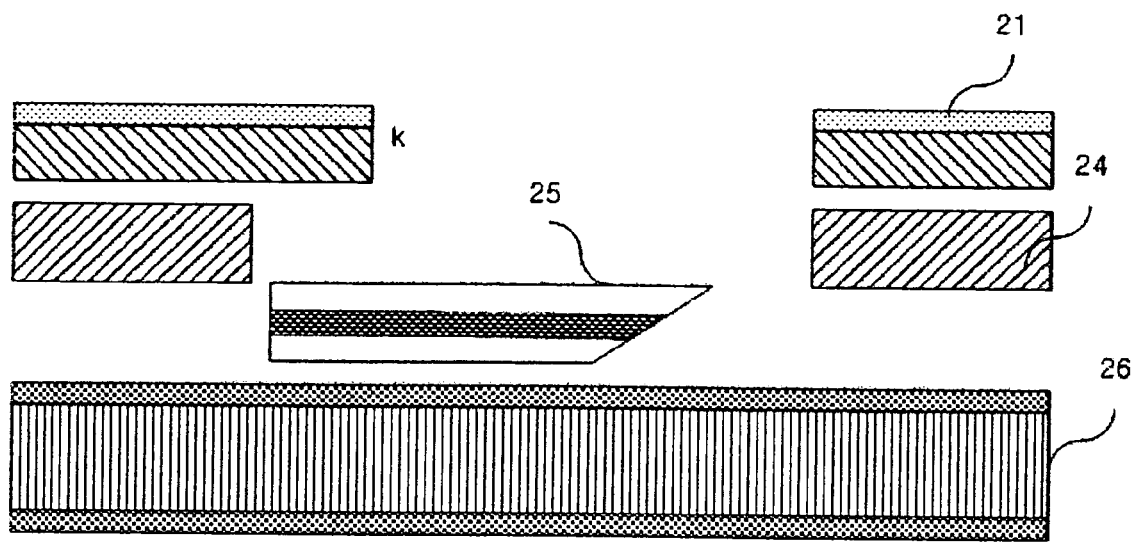
Figure 3E:
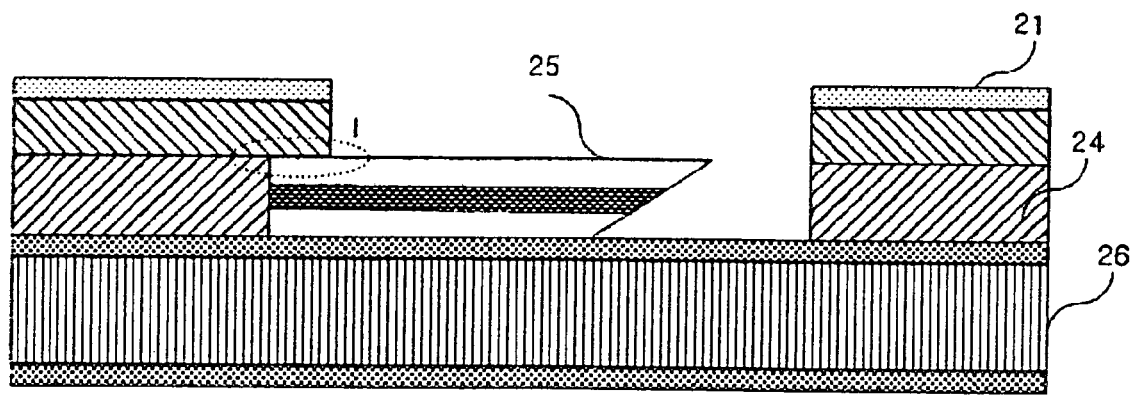

FIGS. 3c to 3e illustrate a top view of a structure in which the optical waveguide, the SSCCL, and the prepreg are combined with each other, a sectional view of the structure in which the optical waveguide, the SSCCL, and the prepreg are not combined with each other, and a sectional view of the structure in which the optical waveguide, the SSCCL, and the prepreg are combined with each other into a single structure, respectively. In more detail, from the top view of FIG. 3c, it can be seen where a portion of the SSCCL which is to be cut is positioned, and contact parts between the optical waveguide, the SSCCL, and the prepreg are positioned. FIG. 3d is a sectional view taken along a line B-B' of FIG. 3c, in which the SSCCL 21, the prepreg 24, and the optical waveguide 25 are not combined with each other. At this time, the portion k shown in FIG. 3c is not thermally deformed. In other words, in the case of the first embodiment, a portion corresponding in position to the portion k of FIG. 3c is slightly thermally deformed, but the portion k is not deformed in the case of the second embodiment because of using the SSCCL, unlike the first embodiment using only the prepreg. Further, in the first embodiment, the epoxy resin is melted and contaminates the optical waveguide at a portion corresponding in position to the portion l of FIG. 3e, unlike the portion l of the second embodiment.

As described above, because the SSCCL 21 and prepreg 24 are combined with the optical waveguide 25 after being pre-routed, the optical signal entrance of the optical waveguide 25, for leading the optical signal, is not coated with the prepreg 24. The combined structure of the SSCCL, the prepreg, and the optical waveguide is, thereafter, subjected to subsequent processes to accomplish the desired multi-layered PCB.

THIRD EMBODIMENT

There will now be given a detailed description of a method of fabricating a multi-layered PCB for optical waveguides according to a third embodiment of the present invention.

FIGS. 4a to 4e illustrate a stepwise fabrication process of a multi-layered PCB for optical waveguides using a thermally curable resin (TC resin) according to the third embodiment of the present invention, in which an adhesive does not block an optical signal entrance of an optical waveguide.

Figure 4A:
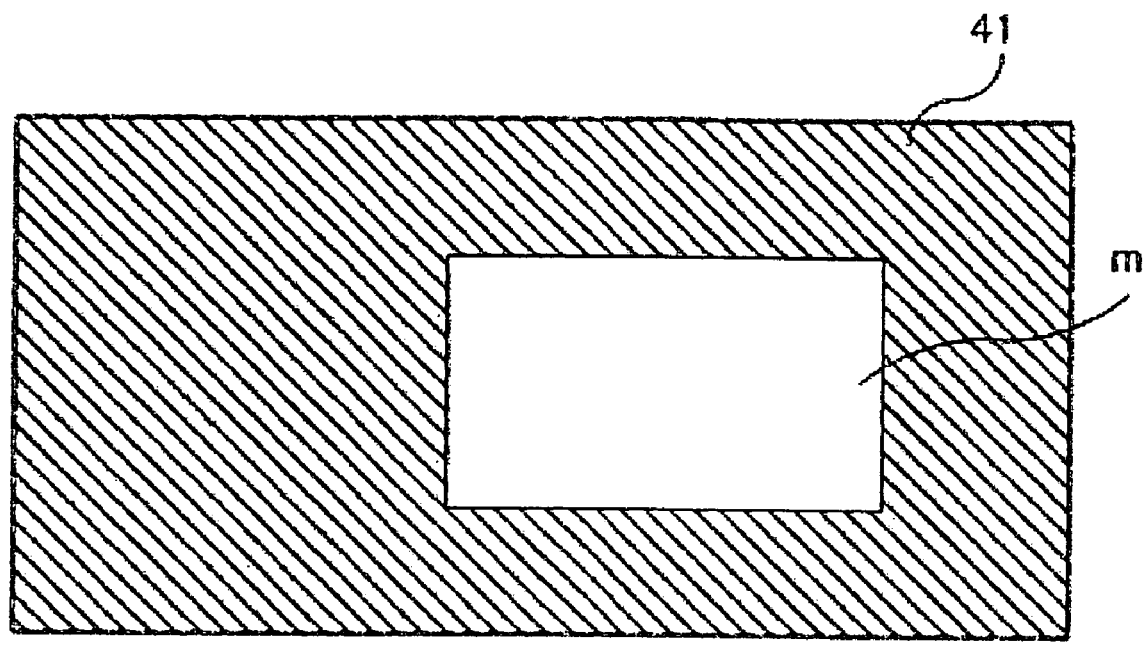
FIGS. 4a to 4e illustrate a stepwise fabrication process of a multi-layered PCB for optical waveguides using a thermally curable resin according to a third embodiment of the present invention, in which an adhesive does not block an optical signal entrance of an optical waveguide.

In detail, FIG. 4a is a top view of the thermally curable resin in which a cut area m is formed in a predetermined shape in order to expose the optical signal entrance of the optical waveguide for leading an optical signal. The ink-typed thermally curable resin is coated on the copper clad laminate by a squeezing process to form a thermally curable resin layer 41. According to the squeezing process, the thermally curable resin is provided in a state of a liquid paste, and pressed and coated on the copper clad laminate to form the thermally curable resin layer 41.

Figure 4B:
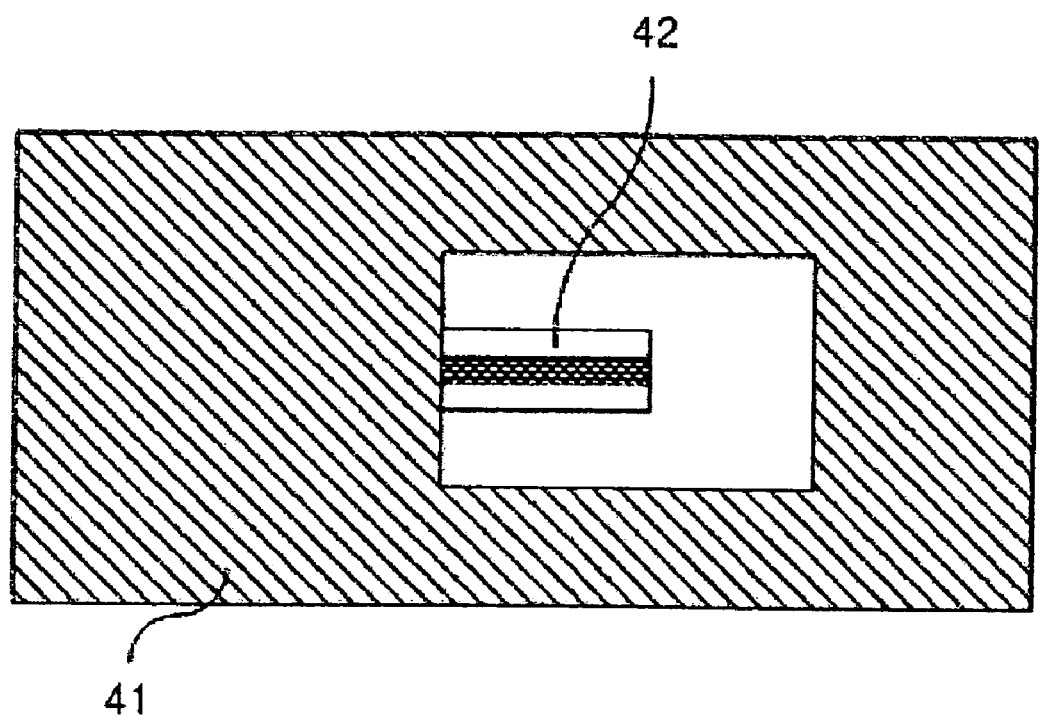

Additionally, FIG. 4b illustrates a top view of the CCL to which the thermally curable resin 41 and the optical waveguide 42 are attached.

Figure 4C:
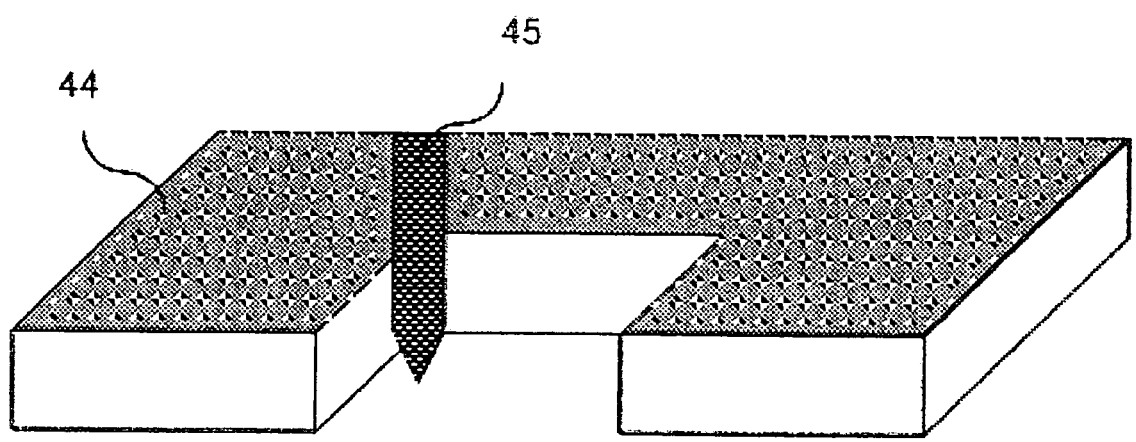

With reference to FIG. 4c, the prepreg 44 is pre-routed so that a stepped part is not formed at a contact part between the optical waveguide and the thermally curable resin. Like the first embodiment, the prepreg 44 is pre-routed using a router bit or a drill bit 45 as shown in FIG. 4c so as to expose a portion of the optical waveguide 42.

Figure 4D:
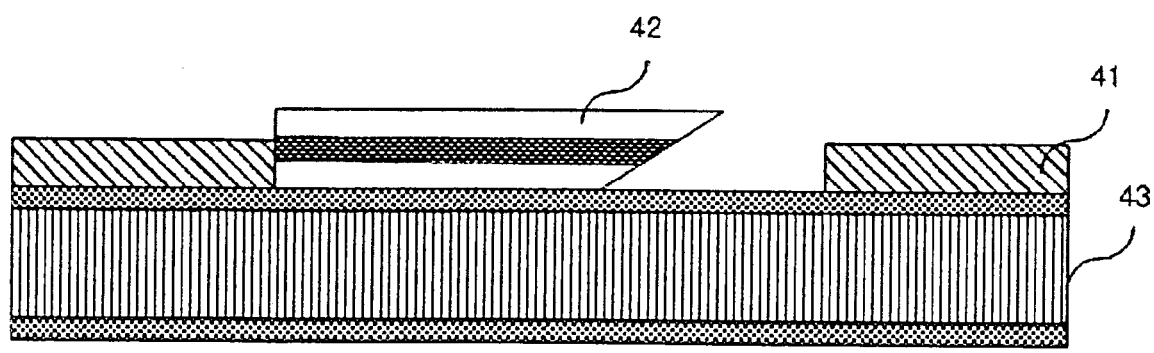
Figure 4E:
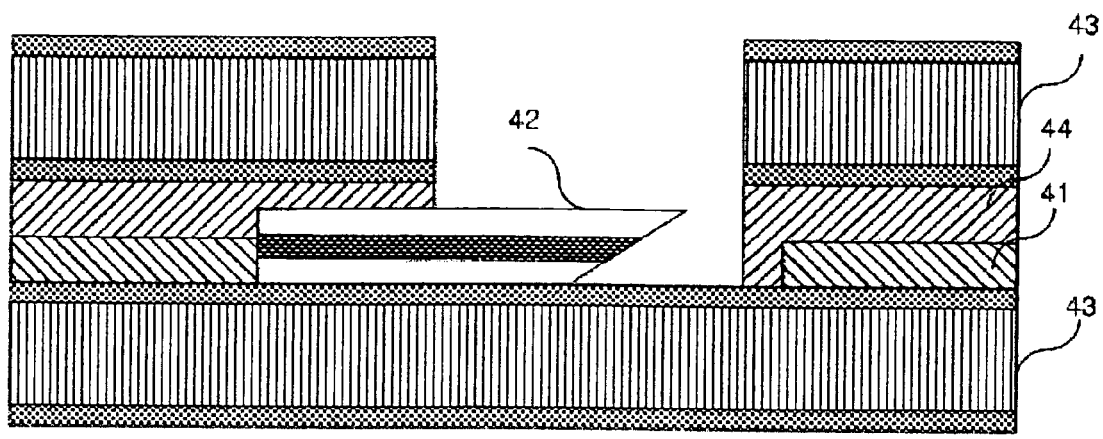

Furthermore, FIGS. 4d and 4e are a sectional view of a structure before the optical waveguide 42 is combined with the prepreg 44, and a sectional view of a combined structure in which the optical waveguide 42 is combined with the prepreg 44 into a single structure, respectively. That is to say, the pre-routed prepreg 44 of FIG. 4d is layered on an upper side of the thermally curable resin 41 to form a laminate as shown in FIG. 4e. At this time, the several pre-routed prepregs 44 may be layered on the thermally curable resin 41 so as to adjust a height of a combined structure of the prepreg and the optical waveguide.

As described above, because the thermally curable resin 41 is pre-routed, the optical waveguide 42 is positioned on the copper clad laminate while the optical waveguide, partially being covered with the prepreg, and the pre-routed prepreg 44 are combined with the optical waveguide 42 on the copper clad laminate 43 into a single structure, the optical signal entrance of the optical waveguide 25 for leading optical signals is not coated with the prepreg 44.

FOURTH EMBODIMENT

There will be given a detailed description of a method of fabricating a multi-layered PCB for optical waveguides according to a fourth embodiment of the present invention.

FIGS. 5a to 5e illustrate a stepwise abrication process of a multi-layered PCB for optical waveguides using a heat spreader according to the fourth embodiment of the present invention, in which an adhesive does not block an optical signal entrance of an optical waveguide.

Figure 5A:
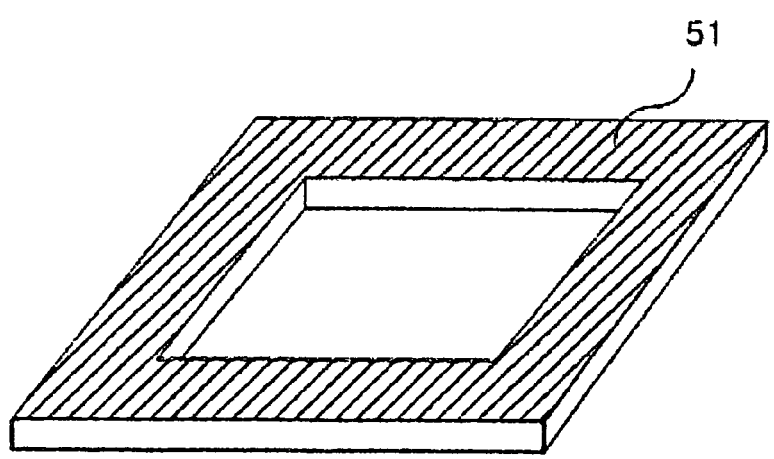
FIGS. 5a to 5e illustrate a stepwise fabrication process of a multi-layered PCB for optical waveguides using a heat spreader according to a fourth embodiment of the present invention, in which an adhesive does not block an optical signal entrance of an optical waveguide.

In detail, FIG. 5a is a top perspective view of the heat spreader 51 in which a partially cut area is formed, by an etching process, in a predetermined shape. The heat spreader 51 consists of a Cu alloy, is inserted between prepreg layers so as to emit high temperature heat for a short time when the heat spreader is combined with the prepregs into a single structure, and acts as a ground in the view of a circuit.

Figure 5B:
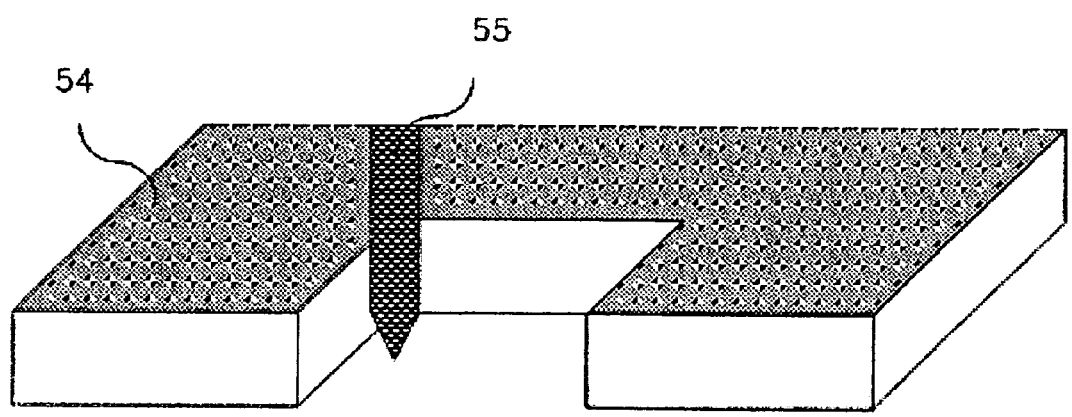

FIG. 5b illustrates a pre-routing process of the prepreg 54, and the pre-routed prepreg 54 is inserted between the heat spreader and an epoxy resin layer of the CCL.

Figure 5C:
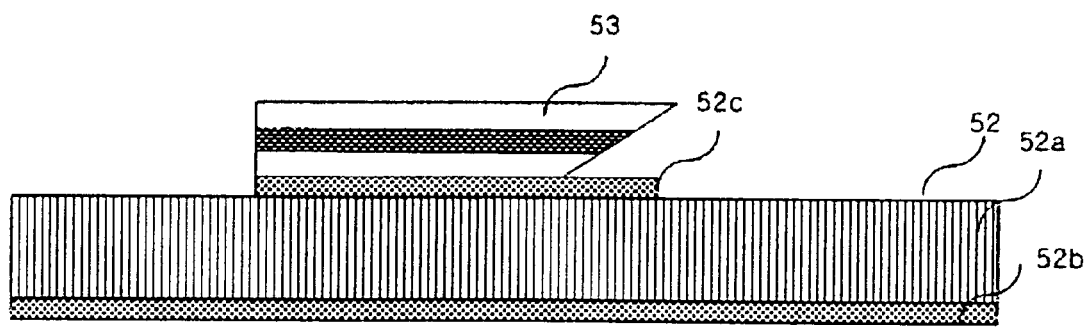
Figure 5D:
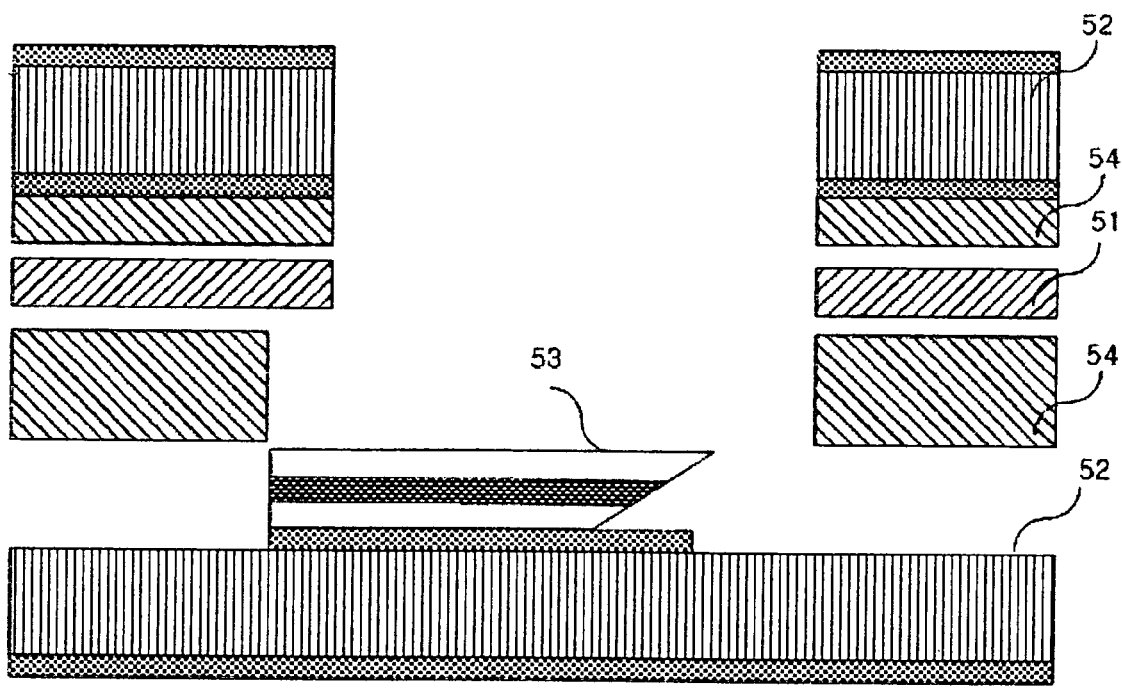
Figure 5E:
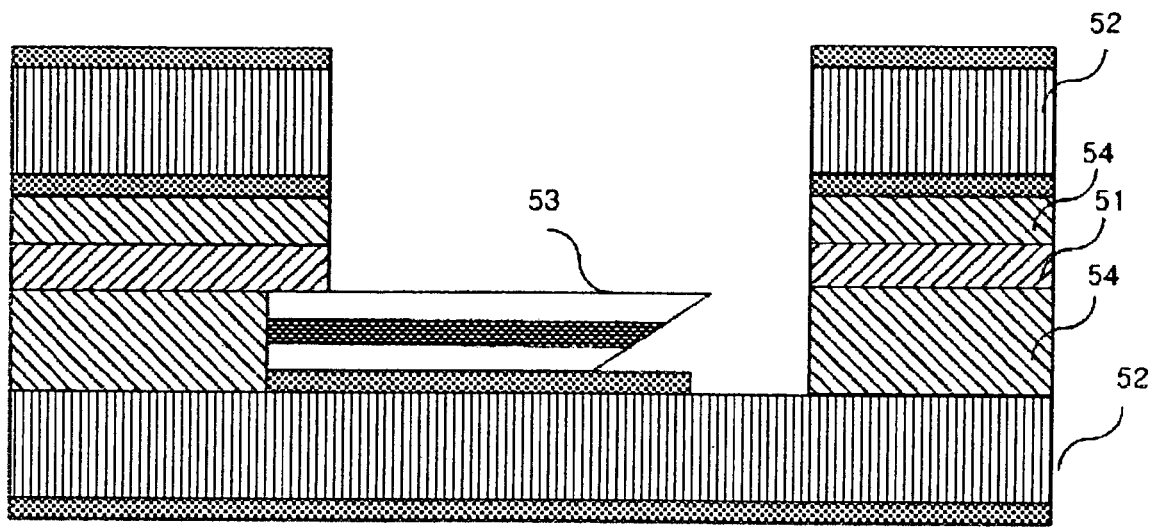

Furthermore, FIG. 5c illustrates a structure in which the optical waveguide 53 is attached to an upper side of the CCL, FIG. 5d illustrates a structure in which the pre-routed prepreg 54 and the heat spreader 51 are not combined with the optical waveguide 53 and the CCL, and FIG. 5e illustrates a combined structure in which the pre-routed prepreg 54 and the heat spreader 51 are combined with the optical waveguide 53 and the CCL into a single structure. As shown in FIG. 5c, an upper copper foil 52c of the CCL 52 may be partially removed so as to smoothly attach the prepreg to the epoxy resin layer of the CCL 52, thereby easily layering the prepreg on the CCL as shown in FIG. 5e.

Therefore, the optical signal entrance of the optical waveguide 53 for leading optical signals is not coated with the prepreg 54 because the heat spreader 51 and the prepreg 54 are combined with the optical waveguide 53 into a single structure after the heat spreader 51, the prepreg 54 are pre-routed, and the optical signal entrance of the optical waveguide 53 is previously formed.

FIFTH EMBODIMENT

There will now be given a detailed description of a method of fabricating a multi-layered PCB for optical waveguides according to a fifth embodiment of the present invention.

FIGS. 6a to 6g illustrate a stepwise fabrication process of a multi-layered PCB for optical waveguides using a unclad according to the fifth embodiment of the present invention, in which an adhesive does not block an optical signal entrance of an optical waveguide.

Figure 6A:
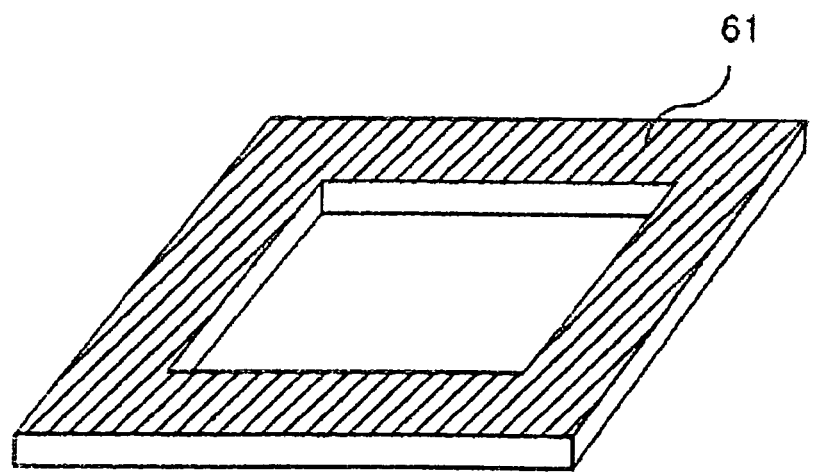
FIGS. 6a to 6g illustrate a stepwise fabrication process of a multi-layered PCB for optical waveguides using an unclad according to a fifth embodiment of the present invention, in which an adhesive does not block an optical signal entrance of an optical waveguide.

In more detail, FIG. 6a is a top perspective view of the unclad 61 in which a partially cut area is formed by an etching process in a predetermined shape. The unclad 61 is used instead of a metal layer of FIG. 5a, that is, the heat spreader, and means a completely cured core (C-stage core) produced by removing copper foils from the CCL. In other words, the traditional CCL has respective copper foils 63b, 62c on both sides thereof as shown in FIG. 6c, but the unclad 61 has no copper foil but consists of an insulating layer 62a as shown in FIG. 6d. At this time, the reference numeral 62a denotes an epoxy insulating core of the CCL, and reference numerals 62b and 62c respectively denote copper foils on both sides of the CCL.

Figure 6B:
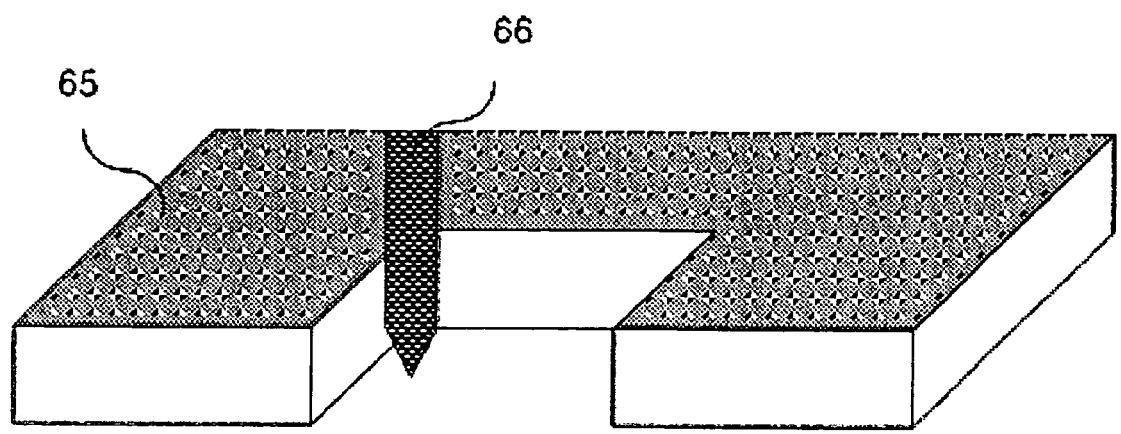
Figure 6C:
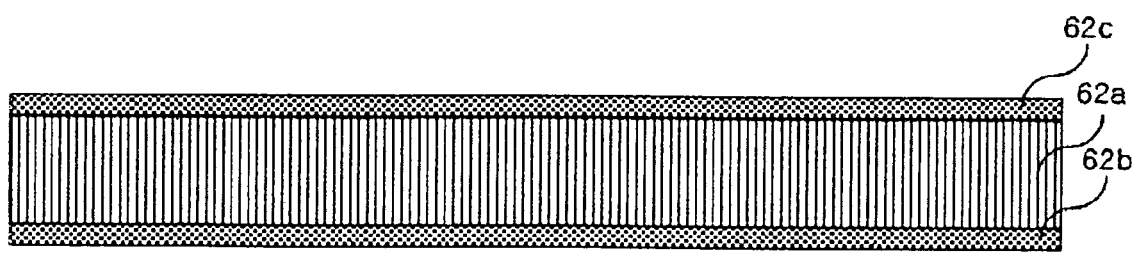
Figure 6D:
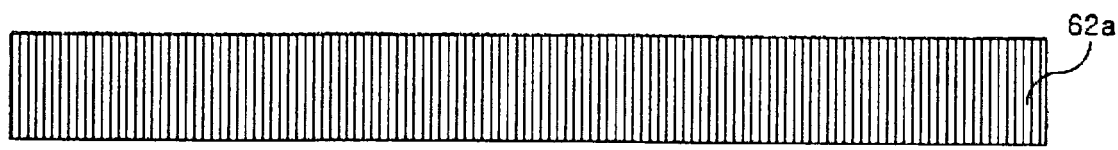

With reference to FIG. 6b, a prepreg 65 is pre-routed so as to smoothly combine a radiating plate with an epoxy side of the CCL.

Figure 6E:
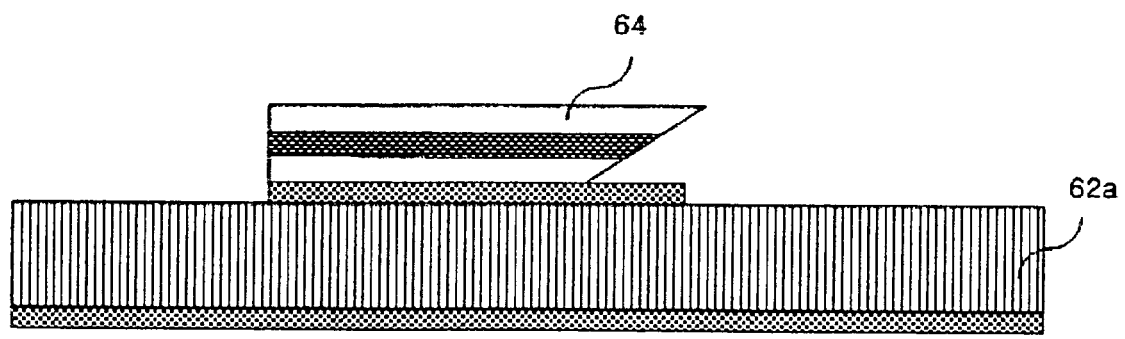

Additionally, in FIG. 6e, the optical waveguide 64 is combined with an upper side of the CCL, and the unclad 61 of FIG. 6a is combined with an upper side of the optical waveguide 64.

Figure 6F:
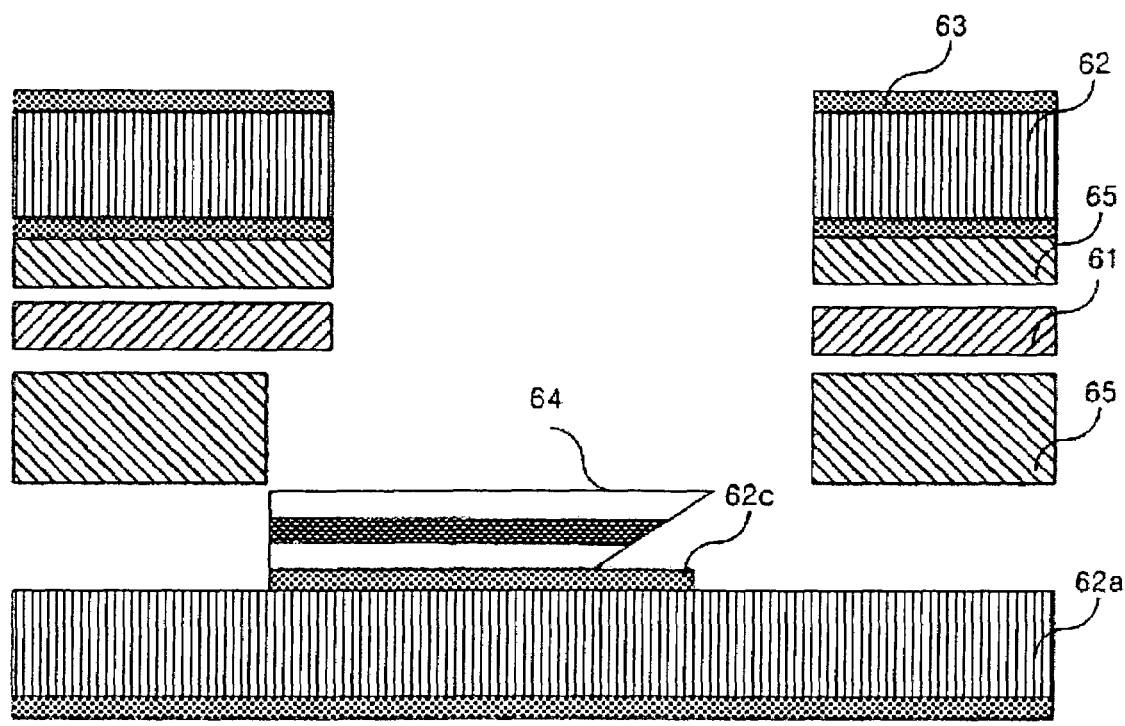
Figure 6G:
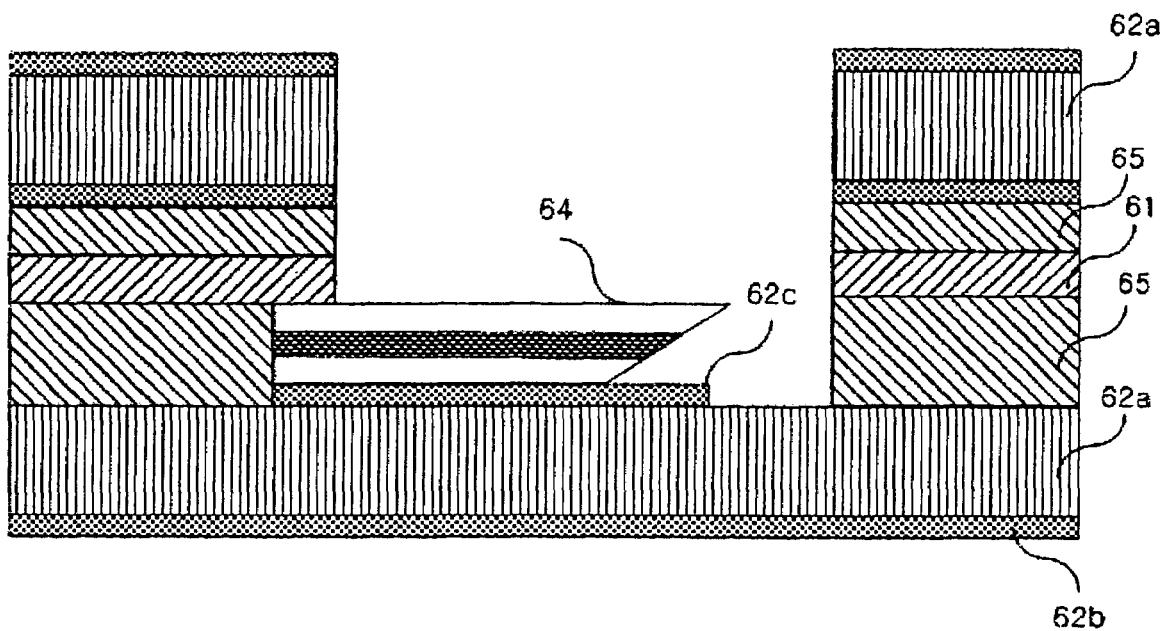

Furthermore, FIG. 6f illustrates a structure in which the pre-routed prepreg 65 and the unclad 61 are not combined with the optical waveguide 64 and the CCL, and FIG. 6g illustrates a combined structure in which the pre-routed prepreg 65 and the unclad 61 are combined with the optical waveguide 64 and the CCL into a single structure. The fifth embodiment is the same as the fourth embodiment except that the unclad 61 is used instead of the heat spreader 51, so a detailed description of the fifth embodiment will be omitted in this specification.

Therefore, the optical signal entrance of the optical waveguide 64, for leading optical signals, is not coated with the prepreg 65 because the unclad 61 and the prepreg 65 are combined with the optical waveguide 53 after the unclad 61 is formed, the prepreg 65 is pre-routed, and the optical signal entrance of the optical waveguide 53 is previously formed.

As described above, the present invention is advantageous in that prepreg and an adhesive weeping prevention layer are pre-routed to prevent an epoxy resin from blocking an optical signal entrance of an optical waveguide, thereby facilitating precise interfacing of optical signals.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of fabricating a multi-layered printed circuit board for optical waveguides, comprising:
   pre-routing a portion of an adhesive meeting an optical waveguide to remove said portion;
   processing an adhesive weeping prevention layer so as to prevent the adhesive from blocking an optical signal entrance of the optical waveguide, said adhesive weeping prevention layer being partially cut;
   arranging the optical waveguide, the adhesive, and the adhesive weeping prevention layer on a copper clad laminate (CCL) such that the optical waveguide is in the removed portion of the adhesive and the adhesive weeping prevention layer is on the adhesive; and
   combining the optical waveguide, the adhesive, a prepreg, and the adhesive weeping prevention layer with each other into a single structure.

2. The method as set forth in claim 1, wherein the adhesive is a low-flow epoxy resin prepreg.

3. The method as set forth in claim 1, wherein the adhesive weeping prevention layer is selected from the group consisting of the prepreg, a single-sided copper clad laminate (SSCCL), a thermally curable resin (TC resin), a heat spreader, and an unclad.

4. The method as set forth in claim 1, wherein the adhesive weeping prevention layer is pre-routed using a router bit or a drill bit.

5. The method as set forth in claim 1, wherein, a cut portion of the adhesive weeping prevention layer is smaller than that of the pre-routed adhesive.

6. A method of fabricating a multi-layered printed circuit board for optical waveguides, comprising:
   pre-routing a first portion of a first prepreg meeting an optical waveguide to remove said first portion;
   pre-routing a second portion of a second prepreg meeting the first prepreg to remove said second portion so as to prevent the first prepreg from blocking an optical signal entrance of the optical waveguide, said second prepreg being partially cut;
   arranging the optical waveguide, the first prepreg, and the second prepreg on a copper clad laminate (CCL) such that the optical waveguide is in the removed portion of the first prepreg and the second prepreg is on the first prepreg; and combining the optical waveguide, the first prepreg, and the second prepreg with each other into a single structure.

7. The method as set forth in claim 6, wherein the first prepreg and the second prepreg are partially cut using a router bit or a drill bit so as to prevent the first prepreg from blocking an optical signal entrance of the optical waveguide.

8. The method as set forth in claim 6, wherein each of the first prepreg and the second prepreg is a low-flow epoxy, resin prepreg.

9. The method as set forth in claim 6, wherein the first prepreg is pre-routed so as to adjust a height of the combined structure of the first prepare, the second prepreg and the optical waveguide.

10. The method as set forth in claim 6, wherein a pre-routed portion of the first prepreg is broader than that of the second prepreg.

11. A method of fabricating a multi-layered printed circuit board for optical waveguides, comprising:
pre-routing a first portion of a single-sided copper clad laminate (SSCCL) to remove said first portion;
pre-routing a second portion of a prepreg meeting an optical waveguide to remove said second portion so as to prevent the first SSCCL from blocking an optical signal entrance of the optical waveguide;
arranging the optical waveguide, the prepreg, and the SSCCL on a copper clad laminate (CCL) such that the optical waveguide is in the removed portion of the prepreg and the SSCCL is on the prepreg; and
combining the optical waveguide, the prepreg, and the SSCCL with each other into a single structure.

12. The method as set forth in claim 11, wherein the SSCCL is pre-routed using a router bit or a drill bit so as to prevent the prepreg from blocking an entrance of the optical waveguide.

13. The method as set forth in claim 11, wherein the prepreg is pre-routed using a router bit or a drill bit so that a stepped part is not formed at a contact part between the optical waveguide and the SSCCL when the optical waveguide is combined with the SSCCL.

14. The method as set forth in claim 11, wherein the prepreg is a low-flow epoxy resin prepreg.

15. The method as set forth in claim 11, wherein the pre-routed portion of the SSCCL is broader than that of the prepreg.

16. A method of fabricating a multi-layered printed circuit board for optical waveguides, comprising:
coating a thermally curable resin on a first copper clad laminate (CCL);
cutting a portion of the thermally curable resin to form an optical signal entrance corresponding to a position which is to be met to an optical waveguide;
pre-routing a portion of a prepreg meeting the optical waveguide to remove said portion of the prepreg;
arranging the optical waveguide, the thermally curable resin, and the prepreg on a second CCL such that the optical waveguide is in the removed portion of the prepreg and the thermally curable resin is on the prepreg; and
combining the optical waveguide, the thermally curable resin, and the prepreg with each other into a single structure.

17. The method as set forth in claim 16, wherein the thermally curable resin has a liquid paste phase, and is coated on the first CCL by a squeezing process.

18. The method as set forth in claim 16, wherein the prepreg is drilled using a router bit or a drill bit so that a stepped part is not formed at a contact part between the optical waveguide and the thermally curable resin when the optical waveguide is combined with the thermally curable resin.

19. The method as set forth in claim 16, wherein the prepreg is a low-flow epoxy resin prepreg.

20. The method as set forth in claim 16, wherein a plurality of prepregs are layered on the thermally curable resin so as to adjust a height of a combined structure of the prepregs and the optical waveguide.

21. A method of fabricating a multi-layered printed circuit board for optical waveguides, comprising:
etching a portion of a heat spreader to form an optical signal entrance;
layering an optical waveguide on a copper clad laminate (CCL);
pre-routing a portion of a prepreg meeting the optical waveguide to remove said portion of the prepreg so as to prevent the head spreader from blocking an optical signal entrance of the optical waveguide;
arranging the optical waveguide, the prepreg, and the heat spreader such that the optical waveguide is in the removed portion of the prepreg and the heat spreader is on the prepreg; and
combining the optical waveguide, the prepreg, and the heat spreader with each other into a single structure.

22. The method as set forth in claim 21, wherein the heat spreader is made of a copper alloy, and acts as a radiating plate, emitting heat generated when the heat spreader is combined with the optical waveguide.

23. The method as set forth in claim 21, wherein the prepreg is pre-routed using a router bit or a drill bit so that the heat spreader comes into contact with an epoxy insulating side of the CCL when the optical waveguide is combined with the heat spreader.

24. The method as set forth in claim 21, wherein the prepreg is a low-flow epoxy resin prepreg.

25. A method of fabricating a multi-layered printed circuit board for optical waveguides, comprising:
etching a portion of an unclad to form an optical signal entrance;
layering an optical waveguide on a copper clad laminate (CCL);
pre-routing a portion of a prepreg meeting the optical waveguide to remove said portion of the prepreg so as to prevent the unclad from blocking an optical signal entrance of the optical waveguide;
arranging the optical waveguide, the prepreg, and the unclad such that the optical waveguide is in the removed portion of the prepreg and the unclad is on the prepreg; and
combining the optical waveguide, the prepreg, and the unclad with each other into a single structure.

26. The method as set forth in claim 25, wherein the unclad is a completely cured core (C-stage core) produced by removing all copper foils from the CCL.

27. The method as set forth in claim 25, wherein the prepreg is pre-routed using a router bit or a drill bit so that the unclad comes into contact with an epoxy insulating side of the CCL when the optical waveguide is combined with the unclad.

28. The method as set forth in claim 25, wherein the prepreg is a low-flow epoxy resin prepreg.

* * * * *